(12) United States Patent
Koyama et al.

(10) Patent No.: US 7,417,477 B2
(45) Date of Patent: Aug. 26, 2008

(54) PLL CIRCUIT

(75) Inventors: Yoshito Koyama, Kawasaki (JP); Koji Nakamuta, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 51 days.

(21) Appl. No.: 11/700,860

(22) Filed: Feb. 1, 2007

(65) Prior Publication Data

US 2008/0036513 A1 Feb. 14, 2008

(30) Foreign Application Priority Data

Aug. 10, 2006 (JP) .............................. 2006-217994

(51) Int. Cl.
*H03L 7/06* (2006.01)

(52) U.S. Cl. ..................................... 327/156

(58) Field of Classification Search ................. 327/147, 327/150, 156, 159
See application file for complete search history.

(56) References Cited

U.S. PATENT DOCUMENTS 6,173,025 B1 1/2001 Jokura
6,731,146 B1 * 5/2004 Gallardo ...................... 327/158
7,242,230 B2 * 7/2007 Boyko et al. ................ 327/156
7,265,635 B2 * 9/2007 Meltzer ........................ 331/16

FOREIGN PATENT DOCUMENTS

JP 10-308667 11/1998

* cited by examiner

*Primary Examiner*—Jeffrey S Zweizig
(74) *Attorney, Agent, or Firm*—Kratz, Quintos & Hanson, LLP

(57) ABSTRACT

To a frequency divider having a reset function, a second clock of a frequency N×Y times higher than that of a first clock is inputted. Upon receipt of a signal indicating that the stop of the input clock is detected by a start/stop detection circuit, the frequency divider having a reset function resets the dividing of a frequency. Then, upon receipt of a signal indicating that the resumption of the input clock is detected by the start/stop detection circuit, the frequency divider generates and inputs a third clock to a phase comparator by starting the dividing of a frequency.

8 Claims, 6 Drawing Sheets

PLL CIRCUIT

BACKGROUND OF THE INVENTION

1. Field of the Invention

The present invention relates to a PLL circuit used in a digital device such as an optical transmission device or a mobile communications device.

2. Description of the Related Art

A PLL circuit is heretofore known, which generates and outputs, based on a predetermined clock originating from an input clock, an output clock of a frequency N times (where N is a positive integer including 1) higher than that of the predetermined clock. This PLL circuit is a circuit, which is favorably incorporated into a digital device such as an optical transmission device or a mobile communications device, and which generates a basic clock required for the digital device.

The purpose of having a PLL circuit in a digital device is to convert a frequency of a clock, which is inputted to the PLL circuit, into a frequency required for the digital device. In addition, a PLL circuit is also used for the purpose of suppressing noise which is superimposed on a clock to be an input. Moreover, even in a state where a clock is not inputted to the PLL circuit, in a digital device, the PLL circuit is also used as a circuit for supplying a clock to a digital circuit which requires a clock to be continuously supplied thereto. This is because the PLL circuit generates a clock of a predetermined frequency without discontinuing a generation of an output clock.

FIG. 5 is a diagram showing a configuration of a conventional PLL circuit using an active filter.

A PLL circuit 100 shown in FIG. 5 is provided with a frequency divider 101. The frequency divider 101 generates a first clock CLK1 by dividing an input clock CLKIN by M (where M is a positive integer not less than 1).

In addition, the PLL circuit 100 is provided with a phase comparator 102 to which the first clock CLK1 and a third clock CLK3 to be described later are inputted. This phase comparator 102 compares a phase of the first clock CLK1 with that of the third clock CLK3. Then, the phase comparator 102 outputs a phase comparison result signal POUT corresponding to a phase difference between these first and third clocks CLK1 and CLK3.

Moreover, the PLL circuit 100 is provided with a pre-filter 103, an active filter 104 and a post-filter 105. The pre-filter 103 is configured of a resistive element 103a and a capacitor element 103b. The active filter 104 is configured of a resistive element 104a, an operational amplifier 104b, a resistive element 104c, a capacitor element 104d and a power supply section 104e. The resistive element 104c and the capacitor element 104d are connected between an input and an output of the operational amplifier 104b, and form an integration circuit. The power supply section 104e generates a reference voltage. Furthermore, the post-filter 105 is configured of a resistive element 105a and a capacitor element 105b. It should be noted that the pre-filter 103 and the post-filter 105 are provided for the purpose of removing a signal of a further higher frequency component than a signal of a high frequency component to be removed by the active filter 104, in the phase comparison result signal POUT to be outputted from the phase comparator 102.

Furthermore, the PLL circuit 100 is provided with a voltage controlled type oscillator 106. This voltage controlled type oscillator 106 outputs a second clock CLK2 of a frequency N times (where N is a positive integer including 1) higher than that of the first clock CLK1, upon receipt of a control input signal CNT to be described later. The second clock CLK2 is outputted to the outside thereof as an output clock CLKOUT via a buffer 107 while being inputted to a frequency divider 108 as well.

The frequency divider 108 outputs the third clock CLK3 by dividing a frequency of the second clock CLK2 by N. The third clock CLK3 is inputted to the phase comparator 102.

In the PLL circuit 100 configured in the manner described above, a phase comparison result signal POUT corresponding to the phase difference between the first CLK1 and the third CLK3 is outputted from the phase comparator 102. The phase comparison result signal POUT is then inputted to one end of the operational amplifier 104b via the pre-filter 103. The operational amplifier 104b obtains a voltage by causing the integration circuit to integrate an output voltage from the operational amplifier 104b and to feed back the result of the integration operation, the integration circuit being configured of the resistive element 104c and the capacitor element 104b. The operation amplifier 104b extracts a low frequency component of the phase comparison result signal POUT by comparing the obtained voltage with the reference voltage inputted to the other end of the operational amplifier 104b. Then, the operation amplifier 104b inputs the low frequency component of the phase comparison result signal POUT, as a control input signal CNT, to the voltage controlled type oscillator 106 via the post-filter 105. As described above, in the PLL circuit 100, the phase comparison result signal POUT, which is a phase error signal corresponding to the difference between the first clock CLK1 and the third clock CLK3, is reflected in a control input signal CNT of a level of a direct current, which is inputted to the voltage controlled type oscillator 106. By this reflection, a loop operation is performed so that the phases of the first clock CLK1 and the third clock CLK3 can be matched with each other. By this loop operation, the output clock CLKOUT to be outputted from the PLL circuit 100 can be synchronized in phase with the input clock CLKIN, and thus an output frequency defined by the following relationship can be obtained.

(Frequency of Output Clock CLKOUT)=(Frequency of Input Clock CLKIN)×$N/M$

FIG. 6 is a diagram showing a configuration of a conventional PLL circuit using a passive filter.

A PLL circuit 200 shown in FIG. 6 is different from the PLL circuit 100 shown in FIG. 5 in that the pre-filter 103 and the active filter 104 are replaced with a lag-lead filter 201.

The lag-lead filter 201 is a low-pass filter constituted of a resistive element 201a, a resistive element 201b and a capacitor element 201c. One end of the resistive element 201a is connected to an output of the phase comparator 102. The resistive element 201b and the capacitor element 201c are connected in series between the other end of the resistive element 201a and the ground.

In this PLL circuit 200, the phase comparison result signal POUT, which corresponds to a phase difference between the first clock CLK1 and the third clock CLK3, and which is outputted from the phase comparator 102, is inputted to the lag-lead filter 201. Subsequently, a low frequency component of the phase comparison result signal POUT is extracted by the lag-lead filter 201. The extracted low frequency component is inputted as a control input signal CNT to the voltage controlled type oscillator 106 via the post-filter 105. As described above, in this PLL circuit 200 as well, the phase comparison result signal POUT, which is a phase error signal corresponding to the phase difference between the first clock CLK1 and the third clock CLK3, is reflected in the control input signal CNT to be inputted to the voltage controlled type oscillator 106. By the reflection, a loop operation is performed so that the phases of the first clock CLK1 and the third CLK3 can be matched with each other. By this loop operation, the output clock CLKOUT outputted from the PLL circuit 200 can be synchronized in phase with the input clock CLKIN.

In general, in a PLL circuit, a period from the time when an input clock is inputted, to the time when an output clock is synchronized in phase with the input clock is termed as a pull-in time, and is considered as one of performances of the PLL. This pull-in time is largely dependent on a loop band (cutoff frequency) and a damping factor, which are main performances of the PLL. Accordingly, in order to shorten the pull-in time, it is necessary to increase the loop band or to decrease the damping factor. To this end, in the pull-in process, arrangement for the loop band to increase and for the damping factor to decrease is made, and thus the pull-in time is shortened.

Here, in Japanese Patent Application Laid-open Official Gazette No. 10-308667, proposed is a technique for shortening a pull-in time in a PLL circuit in which an intermittent operation is employed for the purpose of reducing power consumption. This technique makes it possible to shorten a pull-in time even in a case where a large difference between the phases of an input clock and an output clock is present when returning to a PLL operation. In this technique, reset functions are respectively provided for both a static frequency divider which divides a frequency of the input clock, and a variable frequency divider which divides a frequency of the output clock. At the point when the PLL circuit returns to the PLL operation, an initial phase difference is detected by comparing the phases of the corresponding signals respectively from the two frequency dividers. Then, one of the frequency dividers, in which the signal is advanced in phase, is reset. Subsequently, by releasing the reset in conjunction with the start of the outputting of the frequency divider, in which the signal is delayed in phase, the matching of the phases is performed.

In the technique proposed in Japanese Patent Application Laid-open Official Gazette No. 10-308667, however, the signals, which are inputted to the phase comparator respectively from the two frequency dividers, are transmitted to the subsequent stage after approximately matching the phases of the signals with each other. Accordingly, although the pull-in time after transmitting the signals to the subsequent stage can be shortened, the transmission of the signals to the subsequent stage is blocked until the phases are approximately matched with each other. For this reason, there is a problem that it takes time to complete the pull-in operation when viewed from the time when the input clock is restarted. Moreover, there is a possibility that the phases may change when switching from a period for which to detect the initial phase difference to a period after the matching of the phases is performed.

SUMMARY OF THE INVENTION

The present invention has been made in view of the above circumstances and provides a PLL circuit which is capable of shortening a pull-in time.

A PLL circuit of the present invention is a PLL circuit which generates and outputs an output clock of a frequency N times (where N is a positive integer including 1) higher than that of a first clock, based on the first clock originating from an input clock, the PLL circuit including:

an oscillator which generates a second clock of a frequency N×Y times (where Y is a positive integer not less than 2) higher than that of the first clock, upon receipt of a control input;

an output-side frequency divider which generates an output clock by dividing the frequency of the second clock outputted from the oscillator by Y;

a start/stop detection circuit which detects a stop and a resumption of the input clock;

a frequency divider having a reset function, to which the second clock outputted from the oscillator and a detection result of the stop and the resumption of the input clock detected by the start/stop detection circuit are inputted, and which generates a third clock upon receipt of a detection result of the resumption after the input clock stops once, the third clock being a frequency obtained by dividing the frequency of the second clock by (N×Y), and being adjusted in phase;

a phase comparator, to which the first clock and the third clock generated by the frequency divider are inputted, and which compares a phase of the first clock with a phase of the third clock; and a control input generator which generates and inputs a control input to the oscillator, upon receipt of a result of phase comparison by the phase comparator.

In the PLL circuit of the present invention, the second clock of a frequency N×Y times higher than that of the first clock is inputted to the frequency divider having a reset function. The frequency divider then resets the dividing of the frequency, in response to the stop of the input clock detected by the start/stop circuit. Thereafter, upon receipt of a signal indicating that the inputting of the input clock is again detected by the start/stop detection circuit, the frequency divider having a reset function starts the dividing of the frequency to generate the third clock. The third clock thus generated is inputted to the phase comparator by the frequency divider. Here, the second clock to be inputted to the frequency divider having a reset function has a frequency N×Y times higher than that of the first clock. By including such a frequency divider having a reset function which divides a high frequency, a third clock is generated and inputted to the phase comparator, the third clock being adjusted in phase so as to start at a time relatively close to a start time, for example, of the first clock. Because of this, an initial phase difference between the first and third clocks can be suppressed within a phase difference corresponding to a time period of a cycle of the high frequency. Phase synchronization of the first and third clocks is thus determined immediately. Accordingly, it is possible to achieve the shortening of a pull-in time, without changing any one of a loop band and a damping factor, both of which are the main characteristics of the PLL. The pull-in time is a time period from the inputting of the input clock until the output clock is synchronized with the input clock in phase.

Here, it is preferable that the PLL circuit include an input-side frequency divider which generates the first clock by dividing the frequency of the input clock by M (where M is a positive integer not less than 1).

In such a manner, the frequency (the original frequency) of the first clock inputted to the phase comparator is reduced to 1/M of the original frequency. In comparison with a phase comparator which operates at the original frequency, a circuit configuration of the phase comparator can be simplified.

Moreover, it is preferable that the phase comparator output a clock of the same frequency as that of the third clock when the input clock stops.

In such a manner, when the input clock stops, the phase comparison result of the same frequency as that of the third clock is outputted from the phase comparator. For this reason, the frequency of the oscillator can be kept at the middle frequency between the maximum frequency and the minimum frequency. Accordingly, the output clock can be kept at an average frequency, and this makes it possible to further shorten the pull-in time.

Furthermore, it is also preferable that the control input generator include an integration circuit which stops an integration operation when the input clock stops, upon receipt of the detection result of the stop and the resumption of the input clock detected by the start/stop detection circuit.

In such a manner, by stopping the integration operation when the input clock stops, a voltage of the control input to the oscillator can be kept at an average voltage (for example, in a case where the power supply voltage is 3.3V, the voltage can be a half of the power supply voltage, 1.65V). The output clock thus can be kept at an average frequency. Accordingly, it is possible to further shorten the pull-in time.

It is also preferable that the control input generator include an integration circuit, which is biased to a middle signal level between a first signal level and a second signal level. Here, the first signal level represents a phase comparison result outputted from the phase comparator when the first clock is advanced in phase as compared with the third clock, and the second signal level represents a phase comparison result outputted from the phase comparator when the first clock is delayed in phase as compared with the third clock.

In such a manner, since the control input generator can cause the voltage of the control input to the oscillator to be an average voltage, the output clock can be kept at an average voltage. Accordingly, it is possible to further shorten the pull-in time.

Furthermore, it is preferable that the start/stop detection circuit be configured of a retriggerable mono multivibrator.

In such a manner, the start/stop circuit can be simply configured.

Moreover, it is preferable that the frequency divider having a reset function include the following function. With this function, the frequency divider presets a value of a counter included in the frequency divider at a desired value, upon receipt of a detection result indicating the stop of the input clock detected by the stop/start detection circuit. Then, the frequency divider counts the preset desired value in response to the second clock, upon receipt of a detection result indicating the resumption of the input clock.

In such a manner, anyone of the starting and the stopping of the third clock can be set to a desired phase.

Furthermore, it is preferable that the phase comparison circuit include a first flip-flop, a second flip-flop and an exclusive-OR gate. To the first flip-flop, the first clock originating from the input clock is inputted. To the second flip-flop, the third clock is inputted. To the exclusive-OR gate, output signals respectively from these first and second flip-flops are inputted.

In such a manner, as shown in the embodiments, in a state where the input clock stops once, a signal representing the phase comparison result of the same frequency as that of the third clock is outputted from the phase comparator. Accordingly, the output clock can be kept at an average frequency, and this makes it possible to further shorten the pull-in time.

According to the present invention, it is possible to provide a PLL circuit which is capable of shortening the pull-in time.

DETAILED DESCRIPTION OF THE INVENTION

Hereinafter, embodiments of the present invention will be described.

Figure 1:
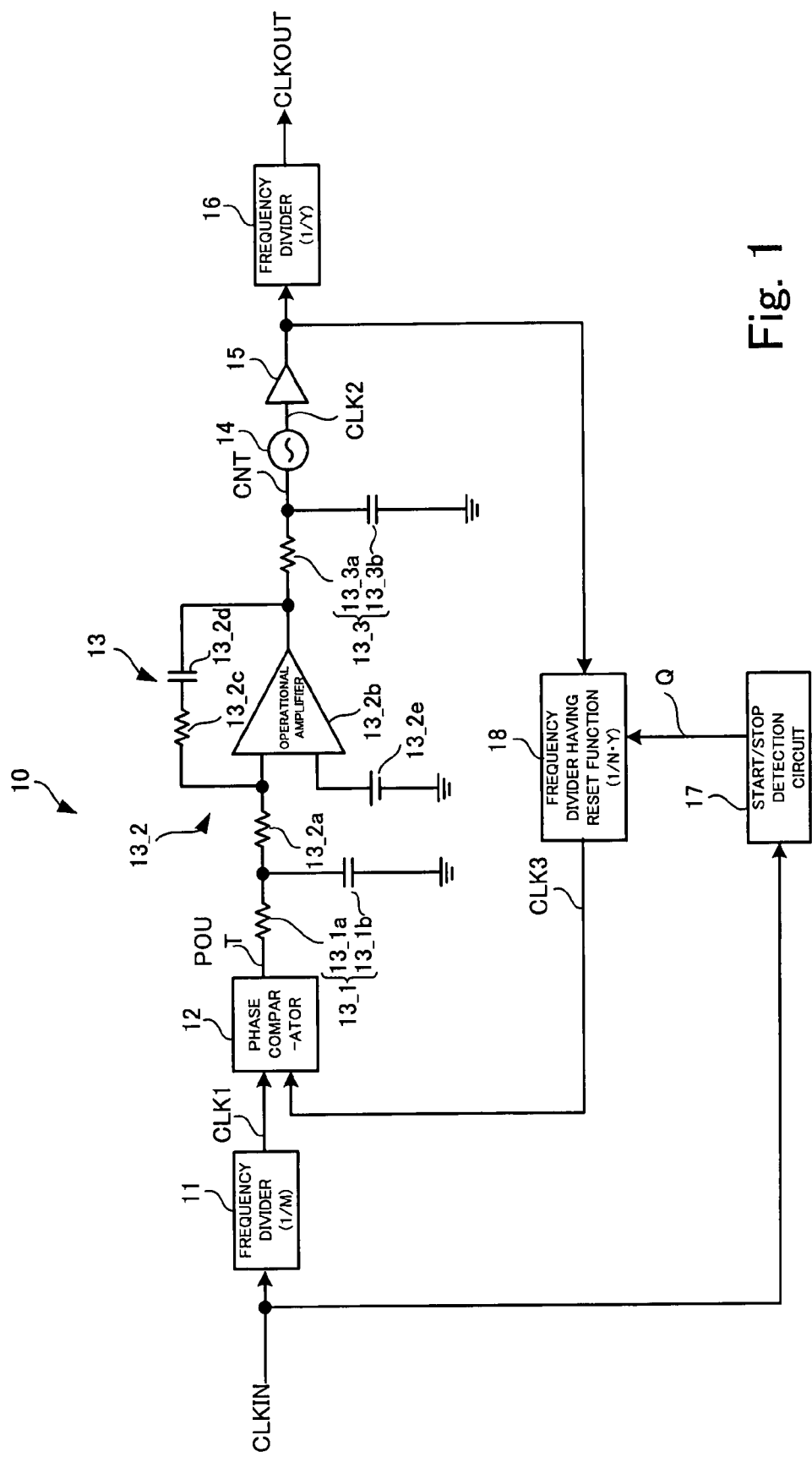
FIG. 1 is a diagram showing a configuration of a first embodiment of a PLL circuit of the present invention.

FIG. 1 is a diagram showing a configuration of a first embodiment of a PLL circuit of the present invention.

A PLL circuit 10 shown in FIG. 1 is a PLL circuit which generates and outputs an output clock CLKOUT of a frequency N times (where N is a positive integer including 1) higher than that of a first clock CLK1, based on the first clock CLK1 originating from an input clock CLKIN.

This PLL circuit 10 is provided with a frequency divider 11 (which corresponds to an example of the input-side frequency divider according to the present invention). The frequency divider 11 divides a frequency of the input clock CLKIN by M (where M is a positive integer not less than 1), thus generating the first clock CLK1.

Moreover, this PLL circuit 10 is provided with a phase comparator 12 to which the first clock CLK1 and a third clock CLK3 to be described later are inputted. The phase comparator 12 compares a phase of the first clock CLK1 with that of the third clock CLK3. Although a circuit configuration of the phase comparator 12 will be described later, this phase comparator 12 outputs a clock of the same frequency as that of the third clock CLK3 when the input clock CLKIN stops.

Furthermore, this PLL circuit 10 is provided with a control input generator 13 which generates a control input signal CNT upon receipt of a phase comparison result signal POUT from the phase comparator 12. This control input generator 13 is configured of a pre-filter 13_1, an active filter 13_2 and a post-filter 13_3. The pre-filter 13_1 is configured of a resistive element 13_1a, and a capacitor element 13_1b. Moreover, the active filter 13_2 is configured of: a resistive element 13_2a; an operational amplifier 13_2b; a resistive element 13_2c and a capacitor element 13_2d, which are connected between an input and an output of the operational amplifier 13_2b, and which also constitute an integration circuit; and power supply section 13_2e which generates a reference voltage. Furthermore, the post-filter 13_3 is configured of a resistive element 13_3a and a capacitor element 13_3b.

Furthermore, this PLL circuit 10 is provided with a voltage controlled type oscillator 14 (which corresponds to an example of the oscillator according to the present invention), a buffer 15, a frequency divider 16 (which corresponds to an example of the output-side frequency divider according to the present invention), a start/stop detection circuit 17, and a frequency divider 18 having a reset function.

The voltage controlled type oscillator 14 outputs a second clock CLK2 of a frequency N times higher than that of the first clock CLK1, upon receipt of a control input signal CNT to be described later. The second clock CLK2 is inputted, via the buffer 15, to the frequency divider 16, and to the frequency divider 18 having a reset function as well.

The frequency divider 16 divides a frequency of the second clock CLK2 outputted from the voltage controlled type oscillator 14 by Y, and then outputs the frequency signal to the outside of the circuit as an output clock CLKOUT.

The start/stop detection circuit 17 detects a stop and a resumption of the input clock CLKIN, and outputs a detection result signal Q, which represents the detection result. To be more specific, this start/stop detection circuit 17 is configured of a retriggerable mono multivibrator, and constant numbers respectively of the resistive element and the capacitor element are defined in accordance with the frequency of the input clock CLKIN. The start/stop detection circuit 17 continues to output an "H" level of a signal as the detection result signal Q while the input clock CLKIN is continuously inputted. On the other hand, in a case where the input clock CLKIN stops for a predetermined time period (time period defined by the constant numbers respectively of the resistive element and the capacitor element) or more, the detection result signal Q changes from the "H" level to an "L" level. Upon input of the input clock CLKIN again, the detection result signal Q changes from the "L" level to the "H" level.

To the frequency divider 18 having a reset function, the second clock CLK2 which is outputted from the voltage controlled type oscillator 14, and the detection result signal Q which represents the detection result of the stop of the input clock CLKIN or the resumption thereof detected by the start/stop detection circuit 17, are inputted. Upon receipt of the signal which represents the resumption of the input clock CLKIN after the input clock CLKIN stops once, the frequency divider 18 having a reset function generates the third clock CLK3 of a frequency, which is obtained by dividing the frequency of the second clock CLK2 by (N×Y), and which is adjusted in phase. Specifically, the frequency divider 18 having a reset function continues to divide the frequency while the detection result signal Q is at the "H" level, and is reset when the detection result signal Q becomes at the "L" level. The frequency divider 18 having a reset function starts dividing the frequency when the input clock CLKIN is inputted again and the detection result signal Q then becomes at the "H" level. Here, the frequency of the second clock CLK2 inputted to the frequency divider 18 having a reset function is a frequency N×Y times higher than that of the first clock CLK1. While providing such frequency divider 18 having a reset function, which divides a high frequency, the third clock CLK3 being adjusted in phase so as to start at a time relatively close to, here, the start time of the first clock CLK1 is generated and inputted to the phase comparator 12. For this reason, an initial phase difference of the first clock CLK1 and the third clock CLK3 can be suppressed to be within a phase difference corresponding to a time period of a cycle of the high frequency. Accordingly, a synchronization of the first clock CLK1 with the third clock CLK3 in phase is defined immediately, and without changing a loop band or a damping factor, which is the main characteristic of the PLL, the shortening of a pull-in time can be achieved. The pull-in time is a time period from the inputting of the input clock CLKIN until the output clock CLKOUT is synchronized with the input clock CLKIN in phase.

Here, the frequency divider 18 having a reset function may include a function of presetting a value of a counter at a desired value when a signal of the "L" level as the detection result signal Q is inputted thereto, and of then counting the preset value with the second clock CLK2. In this manner, the start of the third clock CLK3 can be set in a desired phase.

Next, the pull-in time of the PLL circuit 10 will be described in detail. In a case where a pull-in time is taken into consideration, it is important to consider perspectives on whether or not phases are matched with each other and whether or not frequencies are matched with each other.

As it is termed, a PLL performs phase synchronization, and when phases are matched with each other, it is considered that frequencies are to be matched with each other as well. A synchronization time of the PLL is a time taken for causing the phase and the frequency of the output clock CLKOUT to be matched with the phase and the frequency of the input clock CLKIN. Here, when the input clock CLKIN is inputted, by causing the phase and the frequency of the input clock CLKIN to be matched respectively with the phase and the frequency of the output clock together as described above, without changing the loop band or the damping factor, which is the main characteristic of the PLL, the shortening of the pull-in time can be achieved.

As to a pull-in time at the time when the phase of the PLL changes (Phase step), the pull-in time can be considered in the following equations (refer to "PLL Frequency Synthesizer and Method of Designing the Circuit," Sougou Denshi Shuppan, by Toshiyuki Ozawa).

Although three equations are provided as shown below depending on a damping factor $\zeta$, eventually, each of the equations becomes a function proportional to $\Delta\theta$ (amount of phase step).

[Equation 1]

$$e(t)=\Delta\theta \cdot \text{EXP}\{-\zeta \cdot \omega_n \cdot t\} \cdot (\cos \omega_n \sqrt{(1-\zeta^2)} \cdot t \zeta/(\sqrt{(1-\zeta^2)})) \cdot \sin \omega_n \sqrt{(1-\zeta^2)} \cdot t) \qquad (1)$$

[Equation 2]

$$e(t)=\Delta\theta \cdot \text{EXP}\{-\omega_n \cdot t\} \cdot (1-\omega_n \cdot t) \qquad (2)$$

[Equation 3]

$$e(t)=\Delta\theta \cdot \text{EXP}\{-\zeta \cdot \omega_n \cdot t\} \cdot (\cos h\, \omega_n \sqrt{(\zeta^2-1)} \cdot t - \zeta/(\sqrt{(\zeta^2-1)}) \cdot \sin h\, \omega_n \sqrt{(\zeta^2-1)} \cdot t) \qquad (3)$$

Here, e(t) denotes an error of the PLL. Moreover, $\omega_n$ denotes a natural angular frequency. Furthermore, $\zeta$ in Equations 1, 2, and 3 are defined respectively by the following conditions.

In Equation 1, $\zeta<1$; in Equation 2, $\zeta=1$; and in Equation 3, $\zeta>1$.

e(t) which denotes a difference (an error) of the PLL is reduced when reducing $\Delta\theta$ in Equations 1, 2, and 3. That is, the pull-in can be achieved fast.

Here, the following conditions, for example, are applied to the PLL circuit 10.

(Frequency of Input Clock CLKIN)=8 kHz
(Frequency of Output Clock CLKOUT)=10 MHz
M=1, N=1250

In this case, the frequency of the phase comparator 12 is 8 kHz, and the maximum phase error of the phase comparator 12 is $\pm\pi$, and the time is $\pm 62.5$ μsec.

Here, the frequency divider 18 having a reset function is reset when the inputting of the input clock CLKIN to the PLL circuit 10 stops once. Upon resumption of the inputting of the input clock CLKIN, by causing the third clock CLK3 to have a phase close to that of the input clock CLKIN, the maximum phase error can be suppressed in (N×Y/2) times. That is, $\Delta\theta$ in Equations 1, 2, and 3 are caused to be equal to $\Delta\theta \times 2/(N \times Y)$.

Next, a pull-in time at the time when a frequency changes (frequency step) is considered. A pull-in characteristic at the time when a frequency changes can be considered in the following equations (refer to "PLL Frequency Synthesizer and Method of Designing the Circuit," Sougou Denshi Shuppan, by Toshiyuki Ozawa) in the similar manner to the pull-in characteristic at the time when a phase changes.

[Equation 4]

$$e(t)=\Delta\omega/\omega_n \cdot \exp\{-\zeta \cdot \omega_n \cdot t\} \cdot \sin \omega_n \sqrt{(1-\zeta^2)} \cdot t/(\sqrt{(1-\zeta^2)}) \qquad (4)$$

[Equation 5]

$$e(t) = \Delta\omega/\omega_n \cdot \exp\{-\omega_n \cdot t\} \cdot \omega_n \cdot t \quad (5)$$

[Equation 6]

$$e(t) = \Delta\omega/\omega_n \cdot \exp\{-\zeta \cdot \omega_n \cdot t\} \cdot \sin h\, \omega_n \sqrt{(\zeta^2-1)} \cdot t/(\sqrt{(\zeta^2-1)}) \quad (6)$$

Incidentally ζ in Equations 4, 5, and 6 are defined by the following conditions.

In Equation 4, ζ<1; in Equation 5, ζ=1; and in Equation 6, ζ>1.

In a case of the frequency step, similar to the case of the phase step, reduction in a frequency error is a shortcut to make the pull-in the shortest.

Figure 5:
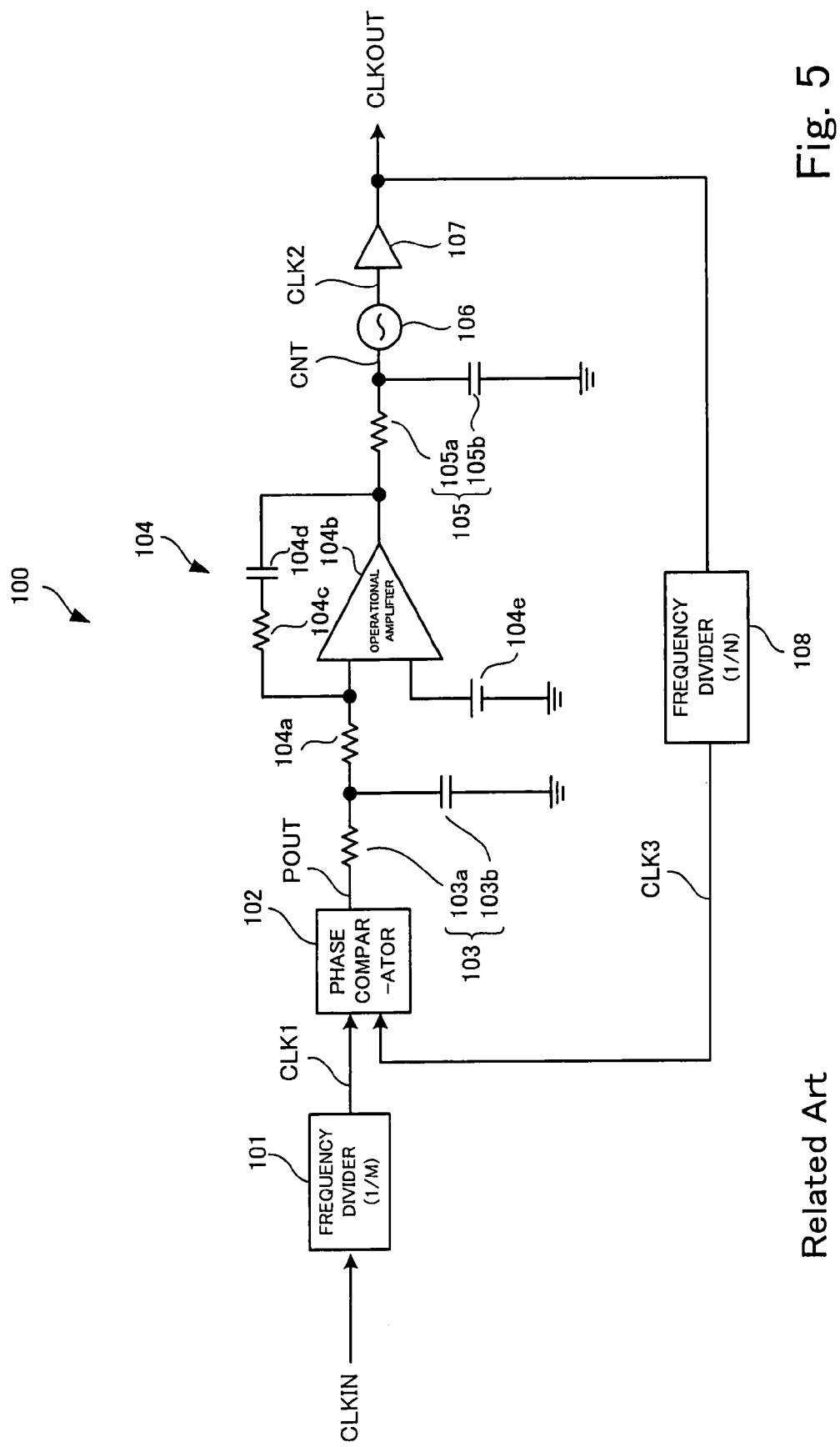
FIG. 5 is a diagram showing a configuration of a conventional PLL circuit using an active filter.
Figure 6:
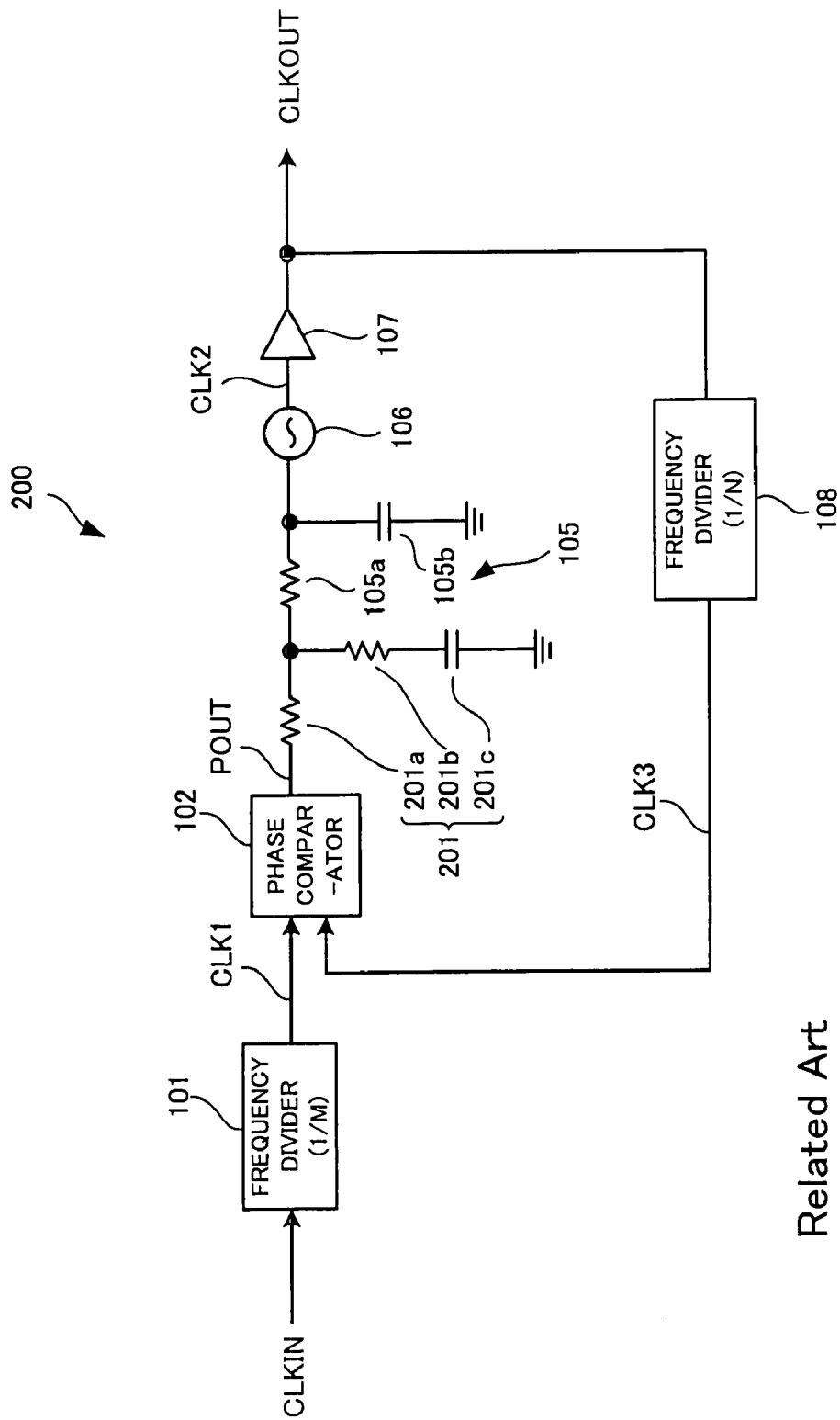
FIG. 6 is a diagram showing a configuration of a conventional PLL circuit using a passive filter.

Here, in a state where the input clock CLKIN stops once, how to keep the output clock CLKOUT at an average frequency is important. For example, it is assumed that the voltage controlled type oscillator 14 is capable of oscillating at a frequency in a range from 5 MHz to 15 MHz. Although its center frequency is 10 MHz, in the case where the input clock CLKIN stops once, since the output voltage of the conventional operational amplifier 104b shown in FIG. 5 exceeds the upper limit (or falls below the lower limit), the frequency of the output clock CLKOUT inevitably becomes 5 MHz or 15 MHz. By adjusting this frequency to be around 10 MHz, the error is surely reduced, and the frequency pull-in can be faster. Hereinafter, descriptions thereof will be given with reference to FIG. 2.

Figure 2:
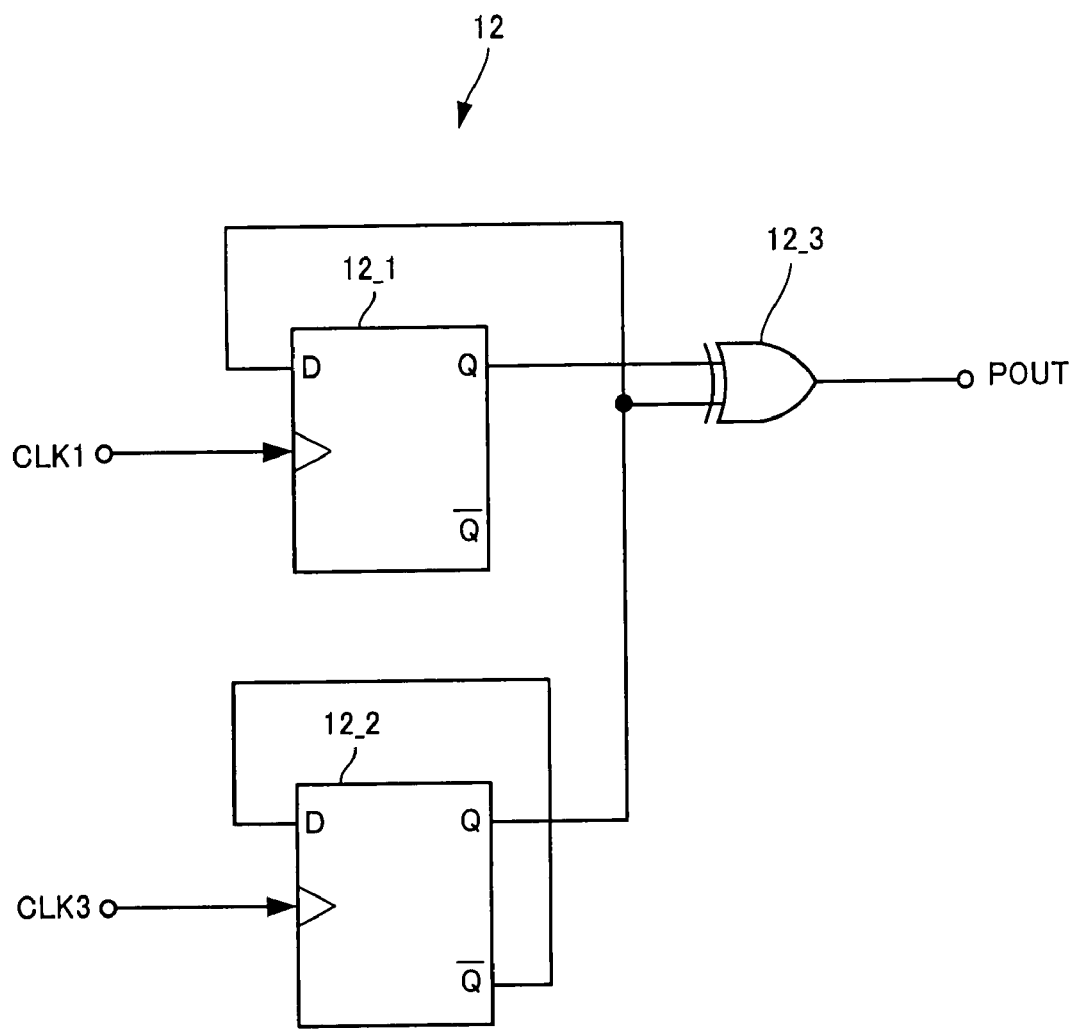
FIG. 2 is a diagram showing a circuit configuration of a phase comparator shown in FIG. 1.

FIG. 2 is a diagram showing a circuit configuration of the phase comparator shown in FIG. 1.

The phase comparator 12 shown in FIG. 2 is provided with a first flip-flop 12_1 to which the first clock CLK1 originating from the input clock CLKIIN is inputted; a second flip-flop 12_2 to which the third clock CLK3 is inputted; and an exclusive-OR gate 12_3 to which output signals of these first and second flip-flops 12_1 and 12_2 are inputted.

In this phase comparator 12, in a case where a signal of the first clock CLK1 is not inputted to the first flip-flop 12_1 with the stop of the input clock CLKIN, a signal at the "L" level is outputted from the first flip-flop 12_1. This signal at the "L" level is inputted to one side of the exclusive-OR gate 12_3. On the other hand, to the second flip-flop 12_2, the third clock CLK3 is inputted. Accordingly, from the second flip-flop 12_2, repeat signals of logical "1" and "0" corresponding to the frequency of the third clock CLK3 is outputted. These repeat signals of logical "1" and "0" are inputted to the other side of the exclusive-OR gate 12_3. Accordingly, from the exclusive-OR gate, the repeat signal, that is, the phase comparison result signal POUT, which is a clock of the same frequency as the third clock CLK3, is outputted.

As in the manner described above, since the phase comparison result signal POUT of the same frequency as the third clock CLK3 is outputted from the phase comparator 12 in the state where the input clock CLKIN stops once, the output clock CLKOUT can be kept at an average frequency. Accordingly, the frequency can be adjusted to the frequency close to 10 MHz described above, and thus, the shortening of the pull-in time can be achieved.

Figure 3:
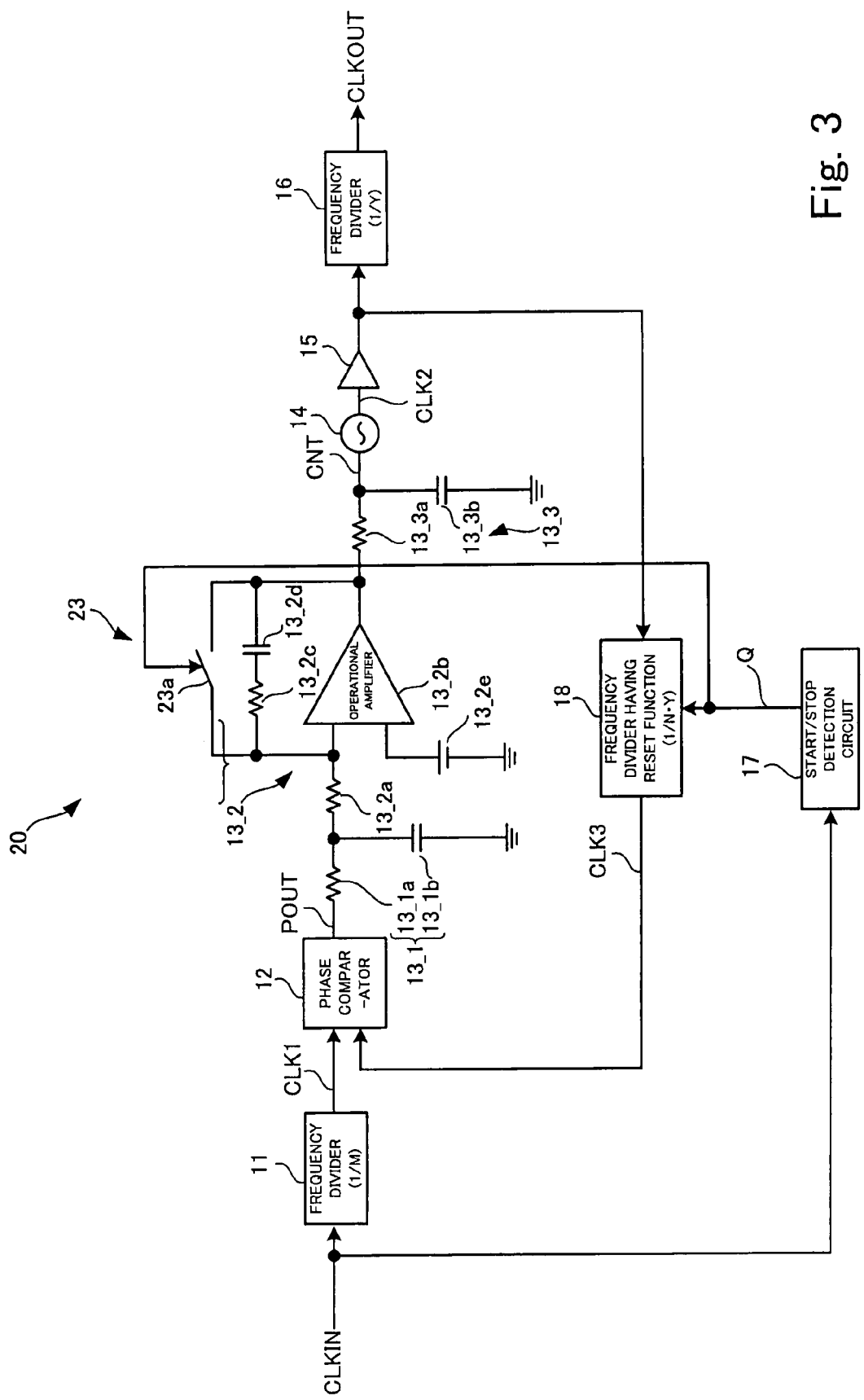
FIG. 3 is a diagram showing a configuration of a second embodiment of a PLL circuit of the present invention.

FIG. 3 is a diagram showing a configuration of a second embodiment of a PLL circuit of the present invention.

It should be noted that the same reference numerals are assigned to the same components as those of the PLL circuit 10 shown in FIG. 1, and different points will be described.

In comparison with the PLL circuit 10 shown in FIG. 1, a PLL circuit 20 shown in FIG. 3 is different in the following point. The PLL circuit 20 is provided with a control input generator 23 including an integration circuit constituted of a resistive element 13_2c, a capacitor element 13_2d, and a switch 23a, instead of the integration circuit constituted of the resistive element 13_2c and the capacitor element 13_2d.

The control input generator 23 receives detection results respectively indicating the stop and the resumption of the input clock CLKIN detected by the start/stop detection circuit 17. This control input generator 23 stops an integration operation by short circuiting the input and output of the operational amplifier 13_2b with the switch 23a when the input clock CLKIN stops. Specifically, in a case where the start/stop circuit 17 detects the stop of the input clock CLKIN and outputs a signal at the "L" level as the detection result signal Q, the switch 23a is switched to an ON state, and thus the integration operation stops. Accordingly, a voltage of the control input signal CNT to the voltage controlled type oscillator 14 becomes an average voltage (for example, in a case where a power supply voltage is 3.3V, the voltage becomes 1.65V which is a half of the power supply voltage). Moreover, this voltage is applied to the capacitor element 13_2d which partially constitutes the integrating circuit as well. In such a manner, in a state where the input clock CLKIN stops once, an average voltage is outputted from the control input generator 23 towards the voltage controlled type oscillator 14. The output clock CLKOUT can be therefore kept at an average frequency. Accordingly, the shortening of the pull-in time can be achieved.

Figure 4:
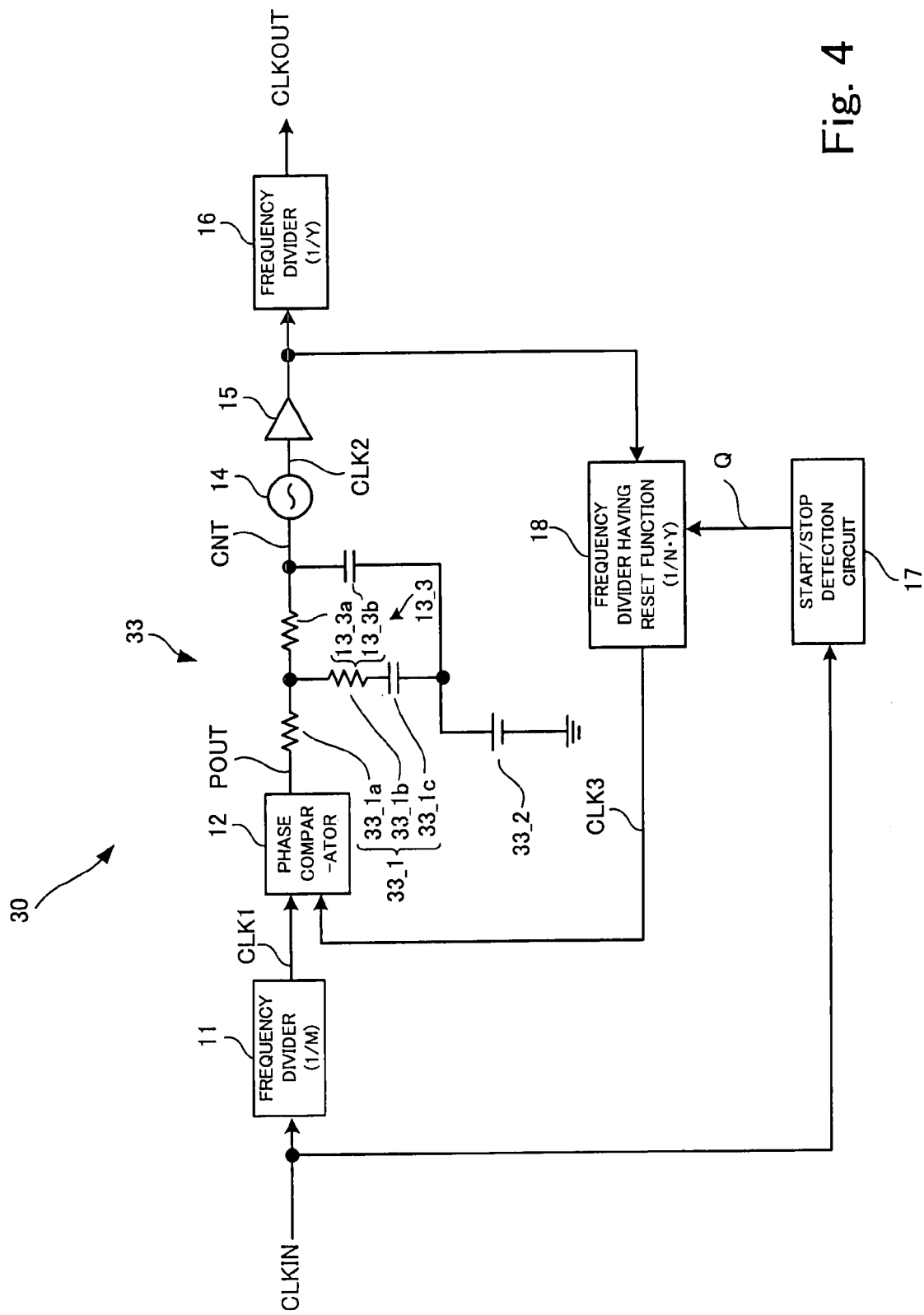
FIG. 4 is a diagram showing a configuration of a third embodiment of a PLL circuit of the present invention.

FIG. 4 is a diagram showing a configuration of a third embodiment of a PLL circuit of the present invention.

It should be noted that the same reference numerals are assigned to the same constituents as those of the PLL circuit 10 shown in FIG. 1, and a different point will be described.

In comparison with the PLL circuit 10 shown in FIG. 1, a PLL circuit 30 shown in FIG. 4 is different in the following point. The control input generator 13, which is constituted of the pre-filter 13_1, the active filter 13_2 and the post-filter 13_3, is replaced by a control input generator 33, which is constituted of a lag-lead filter 33_1, a power supply section 33_2 and a post-filter 13_3.

The control input generator 33 is configured of the lag-lead filter 33_1 and the post-filter 13_3, which constitute an integration circuit. The integration circuit is biased to the middle signal level between a first signal level represented by a phase comparison result signal POUT from the phase comparator 12 at the time when the first clock CLK1 is advanced in phase as compared with the third clock CLK3, and a second signal level represented by a phase comparison result signal POUT from the phase comparator 12 at the time when the first clock CLK1 is delayed in phase as compared with the third clock CLK3.

The lag-lead filter 33_1 is configured of a resistive element 33_1a, a resistive element 33_1b and a capacitor element 33_1c. One end of the resistive element 33_1a is connected to the output of the phase comparator 12. The resistive element 33_1b and the capacitor element 33_1c are connected in series between the other end of the resistive element 33_1a and the power supply section 33_2.

The post-filter 13_3 is configured of a resistive element 13_3a and a capacitor element 13_3b. One end of the resistive element 13_3a is connected to the connection point of the resistive element 33_1a and the resistive element 33_1b. The capacitor element 13_3b is connected between the other end of the resistive element 13_3a and the power supply section 33_2.

As a reference voltage, the power supply section 33_2 outputs a voltage of 1.65V which is a half voltage of a 3.3V of the power supply voltage.

This control input generator 33 receives detection results of the stop and the resumption of the input clock CLKIN detected by the start/stop detection circuit 17. When the input clock CLKIN stops, this control input generator 33 causes the phase comparator 12 to output the phase comparison result signal POUT, which is a clock of the same frequency as that of the third clock CLK3, as described with reference to FIG. 2. Here, an average value of this phase comparison result signal POUT is approximately 1.65V. This average value and a ground voltage (a voltage of 1.65V from the power supply section 33_2) of the lag-lead filter 33_1 and the post-filter 13_3 are substantially the same, the control input voltage CNT, which is inputted to the voltage controlled type oscillator 14, becomes the average voltage (approximately, 1.65V). For this reason, the frequency of the second clock CLK2 outputted from the voltage controlled type oscillator 14 becomes a center frequency. Accordingly, in a state where the input clock CLKIN stops once, the output clock CLK-OUT can be kept at an average frequency, and thereby, the shortening of the pull-in time can be achieved.

What is claimed is:

1. A PLL circuit which generates and outputs an output clock of a frequency N times (where N is a positive integer including 1) higher than that of a first clock, based on the first clock originating from an input clock, the PLL circuit comprising:

an oscillator which generates a second clock of a frequency N×Y times (where Y is a positive integer not less than 2) higher than that of the first clock, upon receipt of a control input;

an output-side frequency divider which generates the output clock by dividing the frequency of the second clock outputted from the oscillator by Y;

a start/stop detection circuit which detects a stop and a resumption of the input clock;

a frequency divider having a reset function, to which the second clock outputted from the oscillator and a detection result of the stop and the resumption of the input clock detected by the start/stop detection circuit are inputted, and which generates a third clock upon receipt of a detection result of the resumption after the input clock stops once, the third clock being a frequency obtained by dividing the frequency of the second clock by (N×Y), and being adjusted in phase;

a phase comparator, to which the first clock and the third clock generated by the frequency divider are inputted, and which compares a phase of the first clock with a phase of the third clock; and a control input generator which generates and inputs a control input to the oscillator, upon receipt of a result of phase comparison by the phase comparator.

2. The PLL circuit according to claim 1, further comprising an input-side frequency divider which generates the first clock by dividing a frequency of the input clock by M (where M is a positive integer not less than 1).

3. The PLL circuit according to claim 1, wherein the phase comparator outputs a clock of the same frequency as that of the third clock when the input clock stops.

4. The PLL circuit according to claim 1, wherein the control input generator includes an integration circuit which stops an integration operation when the input clock stops, in response to the stop and the resumption of the input clock detected by the start/stop detection circuit.

5. The PLL circuit according to claim 1, wherein the control input generator includes an integration circuit which is biased to a middle level between a first signal level and a second signal level, the first signal level representing a phase comparison result outputted from the phase comparator when the first clock is advanced in phase as compared with the third clock, and the second signal level representing a phase comparison result outputted from the phase comparator when the first clock is delayed in phase as compared with the third clock.

6. The PLL circuit according to claim 1, wherein the start/stop detection circuit is configured of a retriggerable mono multivibrator.

7. The PLL circuit according to claim 1, wherein the frequency divider includes functions of presetting a value of a counter included therein at a desired value upon receipt of a detection result of the stop of the input clock detected by the start/stop detection circuit, and of counting the preset desired value in response to the second clock.

8. The PLL circuit according to claim 1, wherein the phase comparison circuit includes:

a first flip-flop to which the first clock originating from the input clock is inputted;

a second flip-flop to which the third clock is inputted; and an exclusive-OR gate to which output signals respectively from these first and second flip-flops are inputted.

* * * * *